(12) United States Patent
Aoi

(10) Patent No.: US 6,828,257 B2
(45) Date of Patent: Dec. 7, 2004

(54) METHOD FOR FORMING INTERLAYER DIELECTRIC FILM

(75) Inventor: Nobuo Aoi, Hyogo (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 35 days.

(21) Appl. No.: 10/224,313

(22) Filed: Aug. 21, 2002

(65) Prior Publication Data

US 2003/0017718 A1 Jan. 23, 2003

Related U.S. Application Data

(62) Division of application No. 09/625,187, filed on Jul. 21, 2000, now Pat. No. 6,458,720.

(30) Foreign Application Priority Data

Jul. 23, 1999 (JP) .......................................... 11-208552

(51) Int. Cl.[7] ......................... H01L 21/31; H01L 21/469
(52) U.S. Cl. ...................................................... 438/780
(58) Field of Search ................................. 438/781, 778, 438/780, 786–790; 427/99, 255.6, 255.7, 515, 578

(56) References Cited

U.S. PATENT DOCUMENTS

| 4,481,229 A | * | 11/1984 | Suzuki et al. ................ 427/571 |
| 4,701,343 A | * | 10/1987 | Ovshinsky et al. .......... 427/575 |
| 5,989,998 A | * | 11/1999 | Sugahara et al. ............ 438/623 |
| 6,068,884 A | | 5/2000 | Rose et al. |
| 6,171,454 B1 | * | 1/2001 | Weber et al. ........... 204/192.12 |

FOREIGN PATENT DOCUMENTS

| JP | 05-239649 A | 9/1993 |
| JP | 07-122552 A | 5/1995 |
| JP | 10-284486 A | 10/1998 |
| JP | 2000-174006 A | 6/2000 |
| JP | 2000-174013 A | 6/2000 |
| JP | 2000-174014 A | 6/2000 |
| JP | 2001-035843 A | 2/2001 |
| WO | WO 92/12535 | 7/1992 |

* cited by examiner

*Primary Examiner*—David A. Zarneke
(74) *Attorney, Agent, or Firm*—Donald B. Studebaker; Nixon Peabody, LLP

(57) ABSTRACT

A method for forming an interlayer dielectric film includes the step of forming the interlayer dielectric film out of an organic/inorganic hybrid film by plasma-polymerizing a source material, including an organosilicon compound, at a relatively high pressure within an environment containing nitrogen gas as a dilute gas.

15 Claims, 3 Drawing Sheets

METHOD FOR FORMING INTERLAYER DIELECTRIC FILM

This application is a divisional of Application Ser. No. 09/625,187, filed Jul. 21, 2000, which is now U.S. Pat. No. 6,458,720.

BACKGROUND OF THE INVENTION

The present invention generally relates to a method for forming an interlayer dielectric film in a multi-level interconnection structure for a semiconductor integrated circuit device. More particularly, the present invention relates to a method for forming an interlayer dielectric film with a low dielectric constant by polymerizing an organic/inorganic hybrid material (e.g., a siloxane material with organosilicon bonds) within plasma.

Examples of the interlayer dielectric film made of a siloxane material with organosilicon bonds include: an organic SOG film formed by a coating technique; and a siloxane film with organosilicon bonds, which is formed by polymerizing an organosilicon compound within plasma.

An organic SOG film is usually formed in the following manner. First, the surface of a substrate is coated with a solution of a siloxane polymer with organosilicon bonds at room temperature to obtain a coating film. Next, the coating film is heated with a hot plate to vaporize the solvent of the solution. Then, the film is hardened at an elevated temperature of 400° C. within an inert gas environment. During this hardening process, silanol (Si—OH) bonds, of which the siloxane polymer is made up, cause dehydration and condensation reactions to form a siloxane polymer. As a result, the organic SOG film is densified.

A siloxane film with organosilicon bonds may be formed by the plasma polymerization process in the following manner. First, an organosilicon compound and an oxidizing agent such as nitrogen monoxide are polymerized with each other by a plasma CVD process, thereby generating organic silanol. Then, the organic silanol bonds themselves are polymerized with each other to obtain a siloxane film with organosilicon bonds.

According to the known method for forming an organic SOG film, however, the solvent is vaporized from the coating by heating the coating. Thus, the solvent in the organic SOG film may not be removed completely, but left in the coating. In such a situation, an outgassing phenomenon, or gradual vaporization of the residual solvent from the organic SOG film, is observed during the heat treatment conducted after the film has been formed. Then, a contact hole cannot be filled in with a metal film satisfactorily due to the outgassing phenomenon. As a result, the resistance of a contact formed in this manner becomes higher than expected.

A similar phenomenon is also observable in forming a siloxane film with organosilicon bonds by a plasma polymerization process. Specifically, when a silanol polymer is formed as a result of the dehydration and condensation reactions of silanol bonds, unreacted silanol is left in the siloxane film. Thus, depending on the conditions of a thermal process during an integration process performed after the film has been formed, the dehydration and condensation reactions of the residual silanol proceed gradually. As a result, an outgassing phenomenon, i.e., vaporization of water produced by the dehydration and condensation reactions of the residual silanol, is also observed and the resistance of a contact formed in this manner rises, too.

In addition, if a siloxane film with organosilicon bonds is formed at 300° C. or more by the plasma polymerization process, then the organosilicon bonds cannot be incorporated into the resultant film effectively. As a result, the dielectric constant of that film is not so low as expected.

To solve these problems, an alternative method of forming a siloxane film was proposed. According to this method, a siloxane film is formed at a temperature as low as room temperature, and then subjected to a special heat treatment at about 200° C., thereby stabilizing the siloxane film obtained. This method is, however, impractical, because the temperature and environment should be controlled too precisely to execute the special heat treatment successfully.

SUMMARY OF THE INVENTION

It is therefore an object of the present invention to form an insulating film having a low dielectric constant with the outgassing phenomenon suppressed and without conducting any special heat treatment.

A first inventive method for forming an interlayer dielectric film includes the step of forming the interlayer dielectric film out of an organic/inorganic hybrid film by plasma-polymerizing a source material at a relatively high pressure within an environment containing nitrogen gas as a dilute gas. The source material includes an organosilicon compound.

According to the first method, the plasma polymerization is produced at a relatively high pressure within an environment containing nitrogen gas. Thus, the electron temperature of the plasma is controllable to a low temperature and the energy of the plasma can be consumed in exciting the nitrogen gas. That is to say, it is possible to suppress the organosilicon bonds from being decomposed by the plasma. As a result, the organosilicon bonds can be effectively incorporated into the organic/inorganic hybrid film and the dielectric constant of the resultant interlayer dielectric film can be reduced.

In addition, since the organosilicon bonds can be incorporated into the organic/inorganic hybrid film effectively, the creation of silanol, which usually causes the outgassing phenomenon, can be suppressed. Furthermore, the organosilicon bonds are more stable thermally than silanol, and are less likely to react irrespective of the conditions of a thermal process during the integration process after the film has been formed. Thus, it is possible to prevent the outgassing phenomenon from being produced in the interlayer dielectric film.

In the first method, the pressure is preferably 650 Pa or more.

Generally speaking, the pressure of a vacuum created differs depending on various process conditions including the temperature inside the reaction chamber of a CVD system, the temperature of a process gas and the volume of the reaction chamber. Thus, the process is preferably controlled by the residence time of the process gas, because the time is constant irrespective of the conditions such as these. Specifically, a one-to-one correspondence is definable between the residence time T of the process gas and the vacuum by the following conversion equation:

$$T = \text{(volume of reaction chamber)}/V2$$
$$= \text{(volume of reaction chamber)} \times (P1/P2) \times (T2/T1) \times V1$$

where $V1$ is the flow rate of the process gas, $V2$ is the flow rate of the gas inside the reaction chamber, $P1$ is the pressure of the process gas, $P2$ is the partial pressure of the process gas inside the reaction chamber, $T1$ is the temperature of the process gas and $T2$ is the temperature inside the reaction chamber.

In the present invention, the volume of the reaction chamber was 127000 ml. The flow rate V1, pressure P1 and temperature T1 of the process gas were kept constant at 2000 ml/min., 101325 Pa and room temperature (=25° C.), respectively. And the temperature T2 inside the reaction chamber was also kept constant at 200° C. Since nitrogen gas was introduced as a dilute gas at 5000 ml/min., the partial pressure P2 of the process gas inside the reaction chamber can be calculated as two-sevenths of the vacuum. The following Table 1 shows the relationship between the vacuum and the residence time of the gas we obtained under these conditions:

TABLE 1

| Atmospheric pressure (Pa) | Vacuum (Pa) | T2 (° C.) | T1 (° C.) | V1 (ml/min.) | V2 (ml/min.) | T (min.) |
|---|---|---|---|---|---|---|
| 101325 | 100 | 200 | 25 | 2000 | 4632000 | 0.027 |
| 101325 | 200 | 200 | 25 | 2000 | 2316000 | 0.055 |
| 101325 | 300 | 200 | 25 | 2000 | 1544000 | 0.082 |
| 101325 | 400 | 200 | 25 | 2000 | 1158000 | 0.110 |
| 101325 | 500 | 200 | 25 | 2000 | 926400 | 0.137 |
| 101325 | 600 | 200 | 25 | 2000 | 712600 | 0.178 |
| 101325 | 700 | 200 | 25 | 2000 | 661700 | 0.192 |
| 101325 | 800 | 200 | 25 | 2000 | 579000 | 0.219 |
| 101325 | 900 | 200 | 25 | 2000 | 514700 | 0.247 |
| 101325 | 1000 | 200 | 25 | 2000 | 463200 | 0.274 |
| 101325 | 1100 | 200 | 25 | 2000 | 421100 | 0.302 |
| 101325 | 1200 | 200 | 25 | 2000 | 386000 | 0.329 |
| 101325 | 1300 | 200 | 25 | 2000 | 356300 | 0.356 |
| 101325 | 1400 | 200 | 25 | 2000 | 330900 | 0.384 |

As shown in Table 1, if the vacuum is 650 Pa or more, then the residence time of the process gas should be 0.178 minute or more.

Accordingly, if the vacuum has a pressure of 650 Pa or more, the electron temperature of the plasma is controllable to a low temperature just as intended and the organosilicon bonds can be incorporated into the organic/inorganic hybrid film with much more certainty. As a result, the dielectric constant of the interlayer dielectric film can be further reduced.

A second inventive method for forming an interlayer dielectric film includes the step of forming the interlayer dielectric film out of an organic/inorganic hybrid film by polymerizing a source material within plasma with a low electron temperature. The source material includes an organosilicon compound.

According to the second method, the organosilicon bonds can also be incorporated into the organic/inorganic hybrid film effectively. Thus, the dielectric constant of the interlayer dielectric film can be reduced and it is possible to prevent the outgassing phenomenon from being produced in the interlayer dielectric film.

In one embodiment of the first or second method, the organosilicon compound preferably has an Si—O—Si bond.

In such an embodiment, the organosilicon bonds can be incorporated into the organic/inorganic hybrid film effectively, and the creation of silanol can be suppressed. Thus, the outgassing phenomenon is even less likely to occur in the interlayer dielectric film. In addition, the percentage of the siloxane bonds formed by the oxidizing agent becomes relatively low among all the siloxane bonds. Accordingly, the density of the organic/inorganic hybrid film can be lowered and the dielectric constant of the interlayer dielectric film can be further reduced.

In another embodiment of the first or second method, the organosilicon compound preferably has an Si—O—R bond, where R is selected from the group consisting of alkyl, allyl and aryl groups.

In such an embodiment, the organic components can be incorporated into the organic/inorganic hybrid film effectively, and the creation of silanol can be suppressed. Thus, the outgassing phenomenon is much less likely to occur in the interlayer dielectric film. In addition, the percentage of three-dimensional siloxane bonds increases and the structure of the organic/inorganic hybrid film is even more similar to that of a pure silicon dioxide film. As a result, the mechanical strength of the organic/inorganic hybrid film increases. Furthermore, since the percentage of Si—O bonds, which can be easily and strongly bonded to various metal films or insulating films, increases, the adhesiveness of the film improves greatly.

In still another embodiment of the first or second method, the organosilicon compound may be selected from the group consisting of hexamethyldisiloxane, methyltrialkoxysilane, dimethyldialkoxysilane, trimethylalkoxysilane, tetramethylsilane and a mixture thereof.

In yet another embodiment of the first or second method, the plasma polymerization is preferably conducted at a temperature of 350° C. or more.

In such an embodiment, the residual silanol can be reduced and the outgassing phenomenon is even less likely to occur in the interlayer dielectric film.

In still another embodiment, the plasma polymerization is preferably conducted within an environment in which an oxidizing agent is contained. Then, the organic/inorganic hybrid film can be formed with much more certainty.

In this particular embodiment, the oxidizing agent is preferably nitrogen monoxide.

Also, the mass of the oxidizing agent contained is preferably equal to or less than its chemical equivalent for the organosilicon compound. In such an embodiment, silicon, contained in the organosilicon compound, is less likely to contribute to the formation of a silicon dioxide film. Accordingly, the organosilicon bonds can be incorporated into the organic/inorganic hybrid film more effectively and the dielectric constant of the interlayer dielectric film can be further reduced.

In still another embodiment, the interlayer dielectric film is preferably formed by heating the organic/inorganic hybrid film to a temperature higher than a temperature set for the plasma polymerization.

In such an embodiment, volatile organic components can be incorporated into the organic/inorganic hybrid film and then vaporized therefrom by a heat treatment. That is to say, the interlayer dielectric film can have its porosity further increased and its density further decreased. As a result, the dielectric constant of the interlayer dielectric film can be further reduced.

In yet another embodiment, an organic compound is preferably contained in the source material.

In such an embodiment, the weight of the organic components incorporated into the organic/inorganic hybrid film increases. As a result, the dielectric constant of the interlayer dielectric film can be further reduced.

DESCRIPTION OF THE PREFERRED EMBODIMENTS

Embodiment 1

A first embodiment of the present invention is a method for forming an interlayer dielectric film using a parallel plate plasma-enhanced CVD system, which includes means for introducing a source material into a reaction chamber by controlling its flow rate with a liquid mass flow controller. According to the first embodiment, the source material contains hexamethyldisiloxane ($(CH_3)_3SiOSi(CH_3)_3$, i.e., an exemplary organic compound with an Si—O—Si bond) as an organosilicon compound.

Into a reaction chamber with its pressure kept at 930 Pa, hexamethyldisiloxane is introduced as a source material at a flow rate of 2000 ml/min. by way of the liquid mass flow controller. At the same time, nitrogen ($N_2$) and nitrogen monoxide ($N_2O$) gases are also introduced thereto as a dilute gas and an oxidizing agent under standard conditions at flow rates of 5000 and 400 ml/min., respectively, thereby producing plasma polymerization reaction in the source material. In this manner, an organic/inorganic hybrid film is deposited on a silicon substrate, which is held at 400° C. within the reaction chamber.

By depositing the film for 60 seconds at a deposition rate of 300 nm/min. under these conditions, an interlayer dielectric film is obtained as the organic/inorganic hybrid film with a thickness of 300 nm.

The capacitance of the interlayer dielectric film obtained in this manner was measured using a mercury prober. As a result, the dielectric constant of the interlayer dielectric film measured 2.5.

Figure 1:
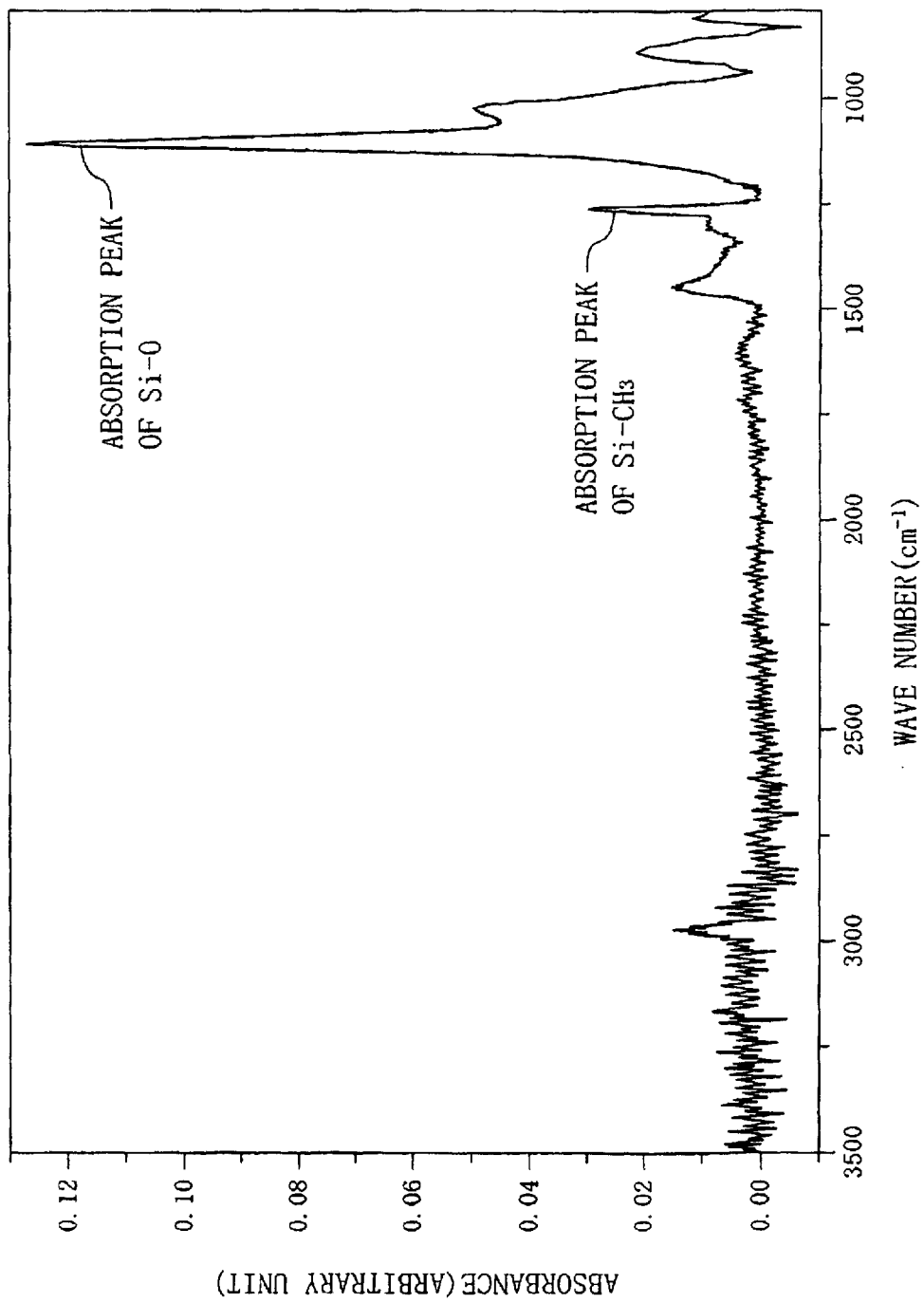
FIG. 1 illustrates absorption peaks observed when an interlayer dielectric film obtained by a first embodiment of the present invention is evaluated using an infrared absorption spectrum.

Also, the absorbance of the resultant interlayer dielectric film was estimated using an infrared absorption spectrum. As a result, an intense absorption peak, attributable to the Si—$CH_3$ bond, was observed as shown in FIG. 1. Thus, we could confirm that the Si—$CH_3$ bonds of hexamethyldisiloxane had been incorporated into the film without having been decomposed by the plasma.

Figure 2:
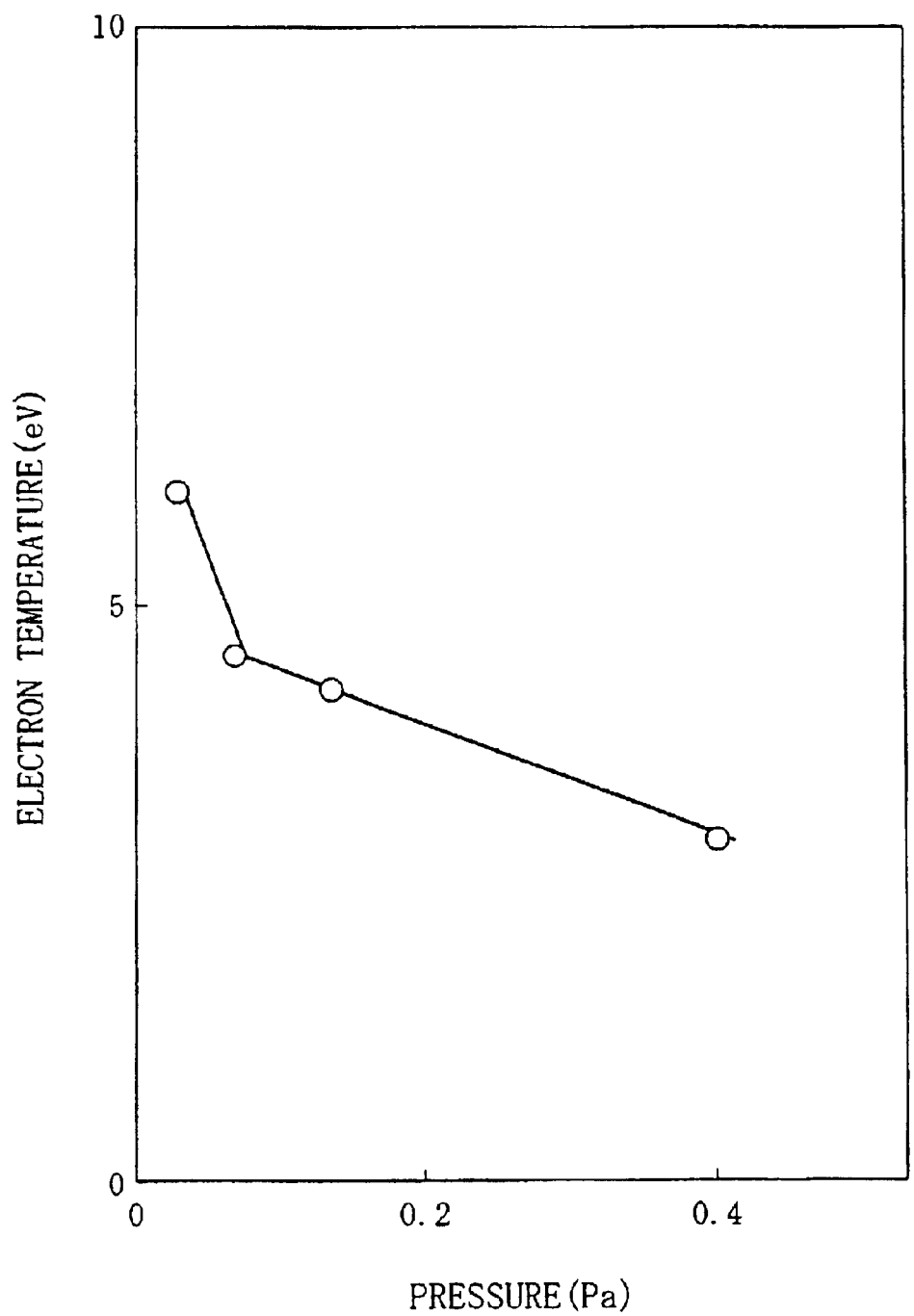
FIG. 2 is a graph illustrating a relationship between the pressure of nitrogen gas and the electron temperature.

FIG. 2 illustrates a relationship between the pressure of the nitrogen gas and the electron temperature. As can be seen from FIG. 2, the lower the vacuum (i.e., the higher the pressure) of the nitrogen gas, the lower the electron temperature of the nitrogen gas. Accordingly, if the plasma polymerization is produced at a relatively high pressure within an environment containing the nitrogen gas, then the electron temperature of the plasma is controllable to a low temperature.

According to the conventional method, in which the plasma polymerization is produced in a high vacuum without introducing nitrogen gas, the Si—$CH_3$ bonds cannot be incorporated into the film being deposited effectively at a deposition temperature of 300° C. or more. Thus, it was reported that the dielectric constant of the resultant interlayer dielectric film is as high as 3 or more.

In contrast, according to the first embodiment, the plasma polymerization is produced at a relatively high pressure within an environment containing nitrogen gas as a dilute gas. Thus, the electron temperature of the plasma can be lowered and the decomposition of the organosilicon bonds (i.e., Si—$CH_3$ bonds) by the plasma can be suppressed.

In addition, since the nitrogen gas is contained in the environment, the energy of the plasma can be consumed in exciting the nitrogen gas. Accordingly, the decomposition of the organosilicon bonds by the plasma can be suppressed with more certainty.

Thus, according to the first embodiment, the organosilicon bonds can be incorporated into the organic/inorganic hybrid film effectively and the dielectric constant of the interlayer dielectric film can be reduced.

In addition, since the organosilicon bonds can be incorporated into the organic/inorganic hybrid film effectively, the creation of silanol, which usually causes the outgassing phenomenon, can be suppressed. Furthermore, the organosilicon bonds are more stable thermally than silanol, and are less likely to react irrespective of the conditions of a thermal process during the integration process after the film has been formed. Thus, it is possible to prevent the outgassing phenomenon from being produced in the interlayer dielectric film.

Moreover, according to the first embodiment, even if the organic/inorganic hybrid film is deposited at a temperature of 350° C. or more, the organosilicon bonds still can be incorporated into the organic/inorganic hybrid film effectively. That is to say, the residual silanol can be reduced by depositing the film at 350° C. or more. Thus, the outgassing phenomenon is much less likely to be produced in the interlayer dielectric film.

In particular, since the source material includes the Si—O—Si bonds according to the first embodiment, the organosilicon bonds can be incorporated into the organic/inorganic hybrid film effectively and the creation of silanol can be suppressed. Thus, the outgassing phenomenon is much less likely to be produced in the interlayer dielectric film.

In addition, since the source material includes the Si—O—Si bonds, the percentage of siloxane bonds formed by the oxidizing agent is relatively low. That is to say, the density of the organic/inorganic hybrid film can be lowered. As a result, the dielectric constant of the interlayer dielectric film can be further reduced.

Furthermore, since the source material includes the Si—O—Si bonds, the adhesiveness of the film greatly improves compared to an organic/inorganic hybrid film obtained by plasma-polymerizing tetramethylsilane in the presence of an oxidizing agent.

Embodiment 2

A second embodiment of the present invention is a method for forming an interlayer dielectric film using a parallel plate plasma-enhanced CVD system, which includes means for introducing a source material into a reaction chamber by controlling its flow rate with a liquid mass flow controller. According to the second embodiment, the source material contains dimethyldiethoxysilane ($(CH_3)_2Si(OC_2H_5)_2$, i.e., an exemplary organic compound with an Si—O—R bond where R is an alkyl, allyl or aryl group) and hexamethyldisiloxane as organosilicon compounds.

Into a reaction chamber with its pressure kept at 930 Pa, dimethyldiethoxysilane and hexamethyldisiloxane are introduced as source materials at a flow rate of 2000 ml/min. by way of the liquid mass flow controller. At the same time, nitrogen and nitrogen monoxide gases are also introduced thereto as a dilute gas and an oxidizing agent under standard conditions at flow rates of 5000 and 400 ml/min., respectively, thereby producing plasma polymerization reaction in the source materials. In this manner, an organic/inorganic hybrid film is deposited on a silicon substrate, which is held at 400° C. within the reaction chamber.

By depositing the film for 60 seconds at a deposition rate of 350 nm/min. under these conditions, an interlayer dielectric film is obtained as the organic/inorganic hybrid film with a thickness of 350 nm.

The capacitance of the interlayer dielectric film obtained in this manner was measured using a mercury prober. As a result, the dielectric constant of the interlayer dielectric film measured 2.6.

Also, the absorbance of the resultant interlayer dielectric film was estimated using an infrared absorption spectrum. As a result, an intense absorption peak, attributable to the Si—$CH_3$ bonds, was observed. Thus, we could confirm that the Si—$CH_3$ bonds of hexamethyldisiloxane and dimethyldiethoxysilane had been incorporated into the film without having been decomposed by the plasma.

According to the second embodiment, the plasma polymerization is produced at a relatively high pressure within an environment containing nitrogen gas as in the first embodiment. Thus, the electron temperature of the plasma can be lowered. In addition, the energy of the plasma can be consumed in exciting the nitrogen gas. Accordingly, the decomposition of the organosilicon bonds by the plasma can be suppressed. Thus, according to the second embodiment, the organosilicon bonds can be incorporated into the organic/inorganic hybrid film effectively and the dielectric constant of the interlayer dielectric film can be reduced.

Also, as in the first embodiment, the thermally stable organosilicon bonds can be incorporated into the organic/inorganic hybrid film effectively, and the creation of silanol can be suppressed. Moreover, the residual silanol can be reduced by depositing the film at 350° C. or more. Thus, the outgassing phenomenon is much less likely to be produced in the interlayer dielectric film.

In particular, since the source materials include the Si—O—R bonds according to the second embodiment, the organic components can be incorporated into the organic/inorganic hybrid film effectively and the creation of silanol can be suppressed. Thus, the outgassing phenomenon is even less likely to occur in the interlayer dielectric film.

In addition, since the source materials include the Si—O—R bonds, the percentage of three-dimensional siloxane bonds is higher than the first embodiment and the structure of the organic/inorganic hybrid film is even more similar to the film structure of a pure silicon dioxide film. As a result, although the dielectric constant slightly increases compared to the first embodiment, the strength of the organic/inorganic hybrid film also increases. Furthermore, since the percentage of Si—O bonds, which can be easily and strongly bonded to various metal films or insulating films, increases, the adhesiveness of the film improves greatly.

Furthermore, since the source materials include the Si—O—Si and Si—O—R bonds, the adhesiveness of the film greatly improves compared to an organic/inorganic hybrid film obtained by plasma-polymerizing tetramethylsilane in the presence of an oxidizing agent.

In the second embodiment, a mixture of hexamethyldisiloxane and dimethyldiethoxysilane is used. Alternatively, any other combination of organosilicon compounds with Si—O—Si and Si—O—R bonds may be used instead.

Embodiment 3

A third embodiment of the present invention is a method for forming an interlayer dielectric film using a parallel plate plasma-enhanced CVD system, which includes means for introducing a source material into a reaction chamber by controlling its flow rate with a liquid mass flow controller. According to the third embodiment, the source material contains hexamethyldisiloxane as an organosilicon compound and decalin (i.e., decahydronaphthalene ($C_{10}H_{18}$)) as an organic compound.

Into a reaction chamber with its pressure kept at 930 Pa, hexamethyldisiloxane and decalin are introduced as source materials at respective flow rates of 2000 and 500 ml/min. by way of the liquid mass flow controller. At the same time, nitrogen and nitrogen monoxide gases are also introduced thereto as a dilute gas and an oxidizing agent under standard conditions at flow rates of 5000 and 400 ml/min., respectively, thereby producing plasma polymerization reaction in the source materials. In this manner, an organic/inorganic hybrid film is deposited on a silicon substrate, which is held at 400° C. within the reaction chamber.

By depositing the film for 60 seconds at a deposition rate of 500 nm/min. under these conditions, an interlayer dielectric film is obtained as the organic/inorganic hybrid film with a thickness of 500 nm.

The capacitance of the interlayer dielectric film obtained in this manner was measured using a mercury prober. As a result, the dielectric constant of the interlayer dielectric film measured 2.2.

Also, the absorbance of the resultant interlayer dielectric film was estimated using an infrared absorption spectrum. As a result, intense absorption peaks, attributable to the Si—$CH_3$ bonds and hydrocarbon polymers, were observed. Thus, we could confirm that the Si—$CH_3$ bonds of hexamethyldisiloxane and hydrocarbon components of decalin had been incorporated into the film without having been decomposed by the plasma.

According to the third embodiment, the plasma polymerization is produced at a relatively high pressure within an environment containing nitrogen gas as in the first embodiment. Thus, the electron temperature of the plasma can be lowered. In addition, the energy of the plasma can be consumed in exciting the nitrogen gas. Accordingly, the decomposition of the organosilicon bonds and decalin by the plasma can be suppressed. Thus, according to the third embodiment, the organosilicon bonds and hydrocarbon components can be incorporated into the organic/inorganic hybrid film effectively and the dielectric constant of the interlayer dielectric film can be reduced. That is to say, compared to the first embodiment, the organic components can be incorporated into the organic/inorganic hybrid film more heavily. As a result, the dielectric constant of the interlayer dielectric film can be further reduced.

Also, as in the first embodiment, the thermally stable organosilicon bonds can be incorporated into the organic/inorganic hybrid film effectively, and the creation of silanol can be suppressed. Moreover, the residual silanol can be reduced by depositing the film at 350° C. or more. Thus, it is possible to prevent the outgassing phenomenon from being produced in the interlayer dielectric film.

In the third embodiment, decalin is used as an exemplary organic compound. Alternatively, methane ($CH_4$), ethane ($C_2H_6$), propane ($C_3H_8$), butane ($C_4H_{10}$), benzene ($C_6H_6$) or hexane ($C_6H_{12}$) may also be used instead.

Embodiment 4

A fourth embodiment of the present invention is a method for forming an interlayer dielectric film using a parallel plate plasma-enhanced CVD system, which includes means for introducing a source material into a reaction chamber by controlling its flow rate with a liquid mass flow controller. According to the fourth embodiment, the source material contains hexamethyldisiloxane as an organosilicon compound.

First, hexamethyldisiloxane is introduced as a source material at a flow rate of 2000 ml/min. into a reaction chamber with its pressure kept at 930 Pa by way of the liquid mass flow controller. At the same time, nitrogen and nitrogen monoxide gases are also introduced thereto as a dilute gas and an oxidizing agent under standard conditions at flow rates of 5000 and 400 ml/min., respectively, thereby producing plasma polymerization reaction in the source material. In this manner, an organic/inorganic hybrid film is deposited on a silicon substrate, which is held at 200° C. within the reaction chamber.

By depositing the film for 60 seconds at a deposition rate of 300 nm/min. under these conditions, an organic/inorganic hybrid film is deposited to a thickness of 300 nm.

Next, the organic/inorganic hybrid film is heated to, and held at, 400° C. within vacuum, thereby obtaining an interlayer dielectric film.

The capacitance of the interlayer dielectric film obtained in this manner was measured using a mercury prober. As a result, the dielectric constant of the interlayer dielectric film measured 2.2.

Also, the absorbance of the resultant interlayer dielectric film was estimated using an infrared absorption spectrum. As a result, an intense absorption peak, attributable to the Si—CH$_3$ bonds, was observed and yet no absorption peaks of volatile organic components were observable. Thus, we could confirm that the Si—CH$_3$ bonds of hexamethyldisiloxane had been incorporated into the film without having been decomposed by the plasma and that the volatile organic components had been vaporized as a result of the heat treatment.

According to the fourth embodiment, the plasma polymerization is produced at a relatively high pressure within an environment containing nitrogen gas as in the first embodiment. Thus, the electron temperature of the plasma can be lowered. In addition, the energy of the plasma can be consumed in exciting the nitrogen gas. Accordingly, the decomposition of the organosilicon bonds by the plasma can be suppressed. As a result, according to the fourth embodiment, the organosilicon bonds can be incorporated into the organic/inorganic hybrid film effectively and the dielectric constant of the interlayer dielectric film can be reduced.

Also, as in the first embodiment, the thermally stable organosilicon bonds can be incorporated into the organic/inorganic hybrid film effectively, and the creation of silanol can be suppressed. Thus, it is possible to prevent the outgassing phenomenon from being produced in the interlayer dielectric film.

In particular, according to the fourth embodiment, an organic/inorganic hybrid film is deposited at as low a temperature as 200° C., and volatile organic components can be incorporated into the organic/inorganic hybrid film. Then, those volatile organic components once incorporated into the film can be vaporized therefrom by heating the organic/inorganic hybrid film to 400° C. Thus, the interlayer dielectric film can have its porosity increased and its density decreased. As a result, the dielectric constant of the interlayer dielectric film can be further reduced.

Embodiment 5

A fifth embodiment of the present invention is a method for forming an interlayer dielectric film using a parallel plate plasma-enhanced CVD system, which includes means for introducing a source material into a reaction chamber by controlling its flow rate with a liquid mass flow controller. According to the fifth embodiment, the source material contains dimethyldiethoxysilane and hexamethyldisiloxane as organosilicon compounds.

First, dimethyldiethoxysilane and hexamethyldisiloxane are introduced as source materials at a flow rate of 2000 ml/min. into a reaction chamber with its pressure kept at 930 Pa by way of the liquid mass flow controller. At the same time, nitrogen and nitrogen monoxide gases are also introduced thereto as a dilute gas and an oxidizing agent under standard conditions at flow rates of 5000 and 400 ml/min., respectively, thereby producing plasma polymerization reaction in the source materials. In this manner, an organic/inorganic hybrid film is deposited on a silicon substrate, which is held at 200° C. within the reaction chamber.

By depositing the film for 60 seconds at a deposition rate of 350 nm/min. under these conditions, an organic/inorganic hybrid film is deposited to a thickness of 350 nm.

Next, the organic/inorganic hybrid film is heated to, and held at, 400° C. within vacuum, thereby obtaining an interlayer dielectric film.

According to the fifth embodiment, the plasma polymerization is produced at a relatively high pressure within an environment containing nitrogen gas as in the first embodiment. Thus, the electron temperature of the plasma can be lowered. In addition, the energy of the plasma can be consumed in exciting the nitrogen gas. Accordingly, the decomposition of the organosilicon bonds by the plasma can be suppressed. As a result, according to the fifth embodiment, the organosilicon bonds can be incorporated into the organic/inorganic hybrid film effectively and the dielectric constant of the interlayer dielectric film can be reduced.

Also, as in the first embodiment, the thermally stable organosilicon bonds can be incorporated into the organic/inorganic hybrid film effectively, and the creation of silanol can be suppressed. Thus, it is possible to prevent the outgassing phenomenon from being produced in the interlayer dielectric film.

In addition, as in the fourth embodiment, the organic/inorganic hybrid film is deposited at as low a temperature as 200° C. and volatile organic components can be incorporated into the organic/inorganic hybrid film. Then, those volatile organic components once incorporated into the film can be vaporized therefrom by heating the organic/inorganic hybrid film to 400° C. Thus, the interlayer dielectric film can have its porosity increased and its density decreased. As a result, the dielectric constant of the interlayer dielectric film can be further reduced.

In particular, since the source materials include the Si—O—Si and Si—O—R bonds according to the fifth embodiment, the percentage of three-dimensional siloxane bonds rises and the strength of the organic/inorganic hybrid film increases. Thus, the shrinkage of the film due to the heat treatment can be suppressed and the organic/inorganic hybrid film can have its porosity further increased and its density further decreased. As a result, the dielectric constant of the interlayer dielectric film can be even lower. Specifically, according to the fifth embodiment, the dielectric constant of the interlayer dielectric film can be reduced to as low as about 1.9.

In the fifth embodiment, a mixture of hexamethyldisiloxane and dimethyldiethoxysilane is used. Alternatively, any other combination of organosilicon compounds with Si—O—Si and Si—O—R bonds may be used instead.

Embodiment 6

A sixth embodiment of the present invention is a method for forming an interlayer dielectric film using a parallel plate plasma-enhanced CVD system, which includes means for introducing a source material into a reaction chamber by controlling its flow rate with a liquid mass flow controller. According to the sixth embodiment, the source material contains hexamethyldisiloxane as an organosilicon compound.

First, hexamethyldisiloxane and methane are introduced as source materials under standard conditions at respective flow rates of 2000 and 500 ml/min. into a reaction chamber with its pressure kept at 930 Pa by way of the liquid mass flow controller. At the same time, nitrogen and nitrogen monoxide gases are also introduced thereto as a dilute gas and an oxidizing agent under standard conditions at flow rates of 5000 and 400 ml/min., respectively, thereby producing plasma polymerization reaction in the source materials. In this manner, an organic/inorganic hybrid film is deposited on a silicon substrate, which is held at 200° C. within the reaction chamber.

By depositing the film for 60 seconds at a deposition rate of 500 nm/min. under these conditions, an organic/inorganic hybrid film is deposited to a thickness of 500 nm.

Next, the organic/inorganic hybrid film is heated to, and held at, 400° C. within vacuum, thereby obtaining an interlayer dielectric film.

According to the sixth embodiment, the plasma polymerization is produced at a relatively high pressure within an environment containing nitrogen gas as in the first embodiment. Thus, the electron temperature of the plasma can be lowered. In addition, the energy of the plasma can be consumed in exciting the nitrogen gas. Accordingly, the decomposition of the organosilicon bonds by the plasma can be suppressed. As a result, according to the sixth embodiment, the organosilicon bonds can be incorporated into the organic/inorganic hybrid film effectively and the dielectric constant of the interlayer dielectric film can be reduced.

Also, as in the first embodiment, the thermally stable organosilicon bonds can be incorporated into the organic/inorganic hybrid film effectively, and the creation of silanol can be suppressed. Thus, it is possible to prevent the outgassing phenomenon from being produced in the interlayer dielectric film.

In addition, as in the fourth embodiment, the organic/inorganic hybrid film is deposited at as low a temperature as 200° C., and volatile organic components can be incorporated into the organic/inorganic hybrid film. Then, those volatile organic components once incorporated into the film can be vaporized therefrom by heating the organic/inorganic hybrid film to 400° C. Thus, the interlayer dielectric film can have its porosity increased and its density decreased. As a result, the dielectric constant of the interlayer dielectric film can be further reduced.

In particular, according to the sixth embodiment, methane is further contained as an additional source material, and the volatile organic components can be incorporated into the organic/inorganic hybrid film more heavily compared to the embodiment where hexamethyldisiloxane alone is used as the only source material. As a result, the dielectric constant of the interlayer dielectric film can be even lower. Specifically, according to the sixth embodiment, the dielectric constant of the interlayer dielectric film can be reduced to as low as about 1.7.

If unsaturated hydrocarbon such as $C_2H_4$ is used instead of methane as an organic compound contained in the source material, then the volatility of the organic components incorporated into the organic/inorganic hybrid film can be increased.

Embodiment 7

A seventh embodiment of the present invention is a method for forming an interlayer dielectric film using a parallel plate plasma-enhanced CVD system, which includes means for introducing a source material into a reaction chamber by controlling its flow rate with a liquid mass flow controller. According to the seventh embodiment, the source material contains dimethyldiethoxysilane and hexamethyldisiloxane as organosilicon compounds.

First, dimethyldiethoxysilane, hexamethyldisiloxane and methane are introduced as source materials under standard conditions at respective flow rates of 5000, 2000 and 200 ml/min. into a reaction chamber with its pressure kept at 930 Pa by way of the liquid mass flow controller. At the same time, nitrogen and nitrogen monoxide gases are also introduced thereto as a dilute gas and an oxidizing agent under standard conditions at flow rates of 5000 and 400 ml/min., respectively, thereby producing plasma polymerization reaction in the source materials. In this manner, an organic/inorganic hybrid film is deposited on a silicon substrate, which is held at 200° C. within the reaction chamber.

By depositing the film for 60 seconds at a deposition rate of 450 nm/min. under these conditions, an organic/inorganic hybrid film is deposited to a thickness of 450 nm.

Next, the organic/inorganic hybrid film is heated to, and held at, 400° C. within vacuum, thereby obtaining an interlayer dielectric film.

According to the seventh embodiment, the plasma polymerization is produced at a relatively high pressure within an environment containing nitrogen gas as in the first embodiment. Thus, the electron temperature of the plasma can be lowered. In addition, the energy of the plasma can be consumed in exciting the nitrogen gas. Accordingly, the decomposition of the organosilicon bonds by the plasma can be suppressed. As a result, according to the seventh embodiment, the organosilicon bonds can be incorporated into the organic/inorganic hybrid film effectively and the dielectric constant of the interlayer dielectric film can be reduced.

Also, as in the first embodiment, the thermally stable organosilicon bonds can be incorporated into the organic/inorganic hybrid film effectively, and the creation of silanol can be suppressed. Thus, it is possible to prevent the outgassing phenomenon from being produced in the interlayer dielectric film.

In addition, as in the fourth embodiment, the organic/inorganic hybrid film is deposited at as low a temperature as 200° C., and volatile organic components can be incorporated into the organic/inorganic hybrid film. Then, those volatile organic components once incorporated into the film can be vaporized therefrom by heating the organic/inorganic hybrid film to 400° C. Thus, the interlayer dielectric film can have its porosity increased and its density decreased. As a result, the dielectric constant of the interlayer dielectric film can be further reduced.

In particular, since the source materials contain a greater number of Si—O—R bonds according to the seventh embodiment, the percentage of three-dimensional siloxane bonds further rises and the strength of the organic/inorganic hybrid film greatly increases. Thus, the organic/inorganic hybrid film can have its porosity further increased and its density further decreased. As a result, the dielectric constant of the interlayer dielectric film can be even lower. Specifically, according to the seventh embodiment, the dielectric constant of the interlayer dielectric film can be reduced to as low as about 1.7.

In the foregoing first through seventh embodiments, nitrogen gas is contained as a dilute gas in the environment. Thus, the organic/inorganic hybrid film is partially nitrided and the interlayer dielectric film can effectively prevent copper atoms, which will make a copper film, from diffusing.

In the foregoing embodiments, nitrogen gas is used as a dilute gas for lowering the electron temperature of the plasma. Alternatively, argon or helium gas may also be used instead.

However, the electron temperature tends to be proportional to an ionization potential and the ionization potential of nitrogen gas (15.59 eV) is lower than that of argon gas (15.76 eV) or helium gas (24.59 eV). Thus, nitrogen gas is preferably used as the dilute gas to lower the electron temperature of the plasma.

Also, in the foregoing embodiments, the plasma polymerization is produced in a reaction chamber with its pressure kept at 930 Pa. However, the electron temperature of the plasma is controllable to a sufficiently low temperature if the pressure inside the reaction chamber is 650 Pa or more.

Figure 3:
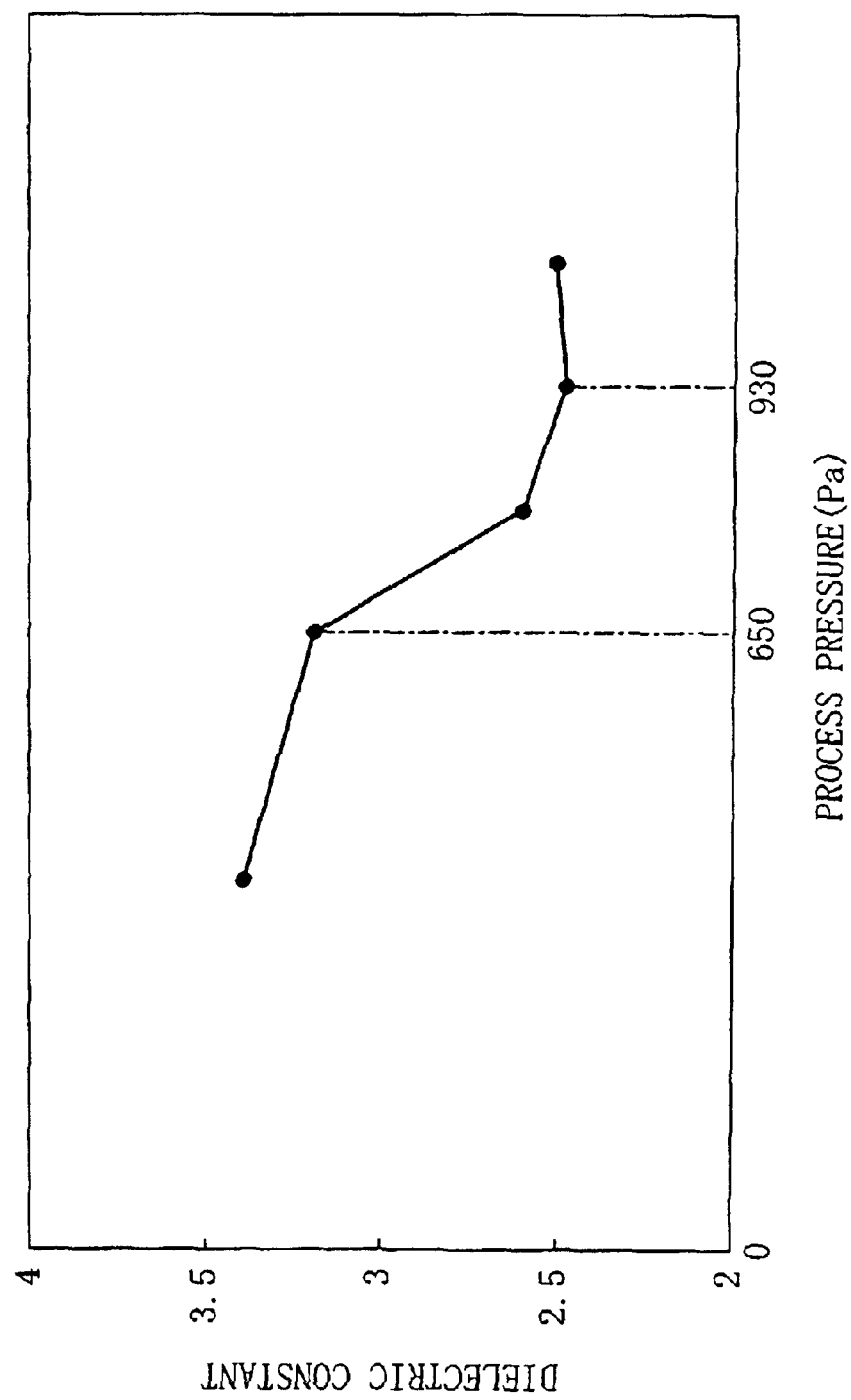
FIG. 3 is a graph illustrating a relationship between the process pressure and the dielectric constant of the interlayer dielectric film.

FIG. 3 illustrates a relationship between the process pressure (i.e., a pressure inside the reaction chamber) and the dielectric constant of an interlayer dielectric film. As can be seen from FIG. 3, if the process pressure is lower than 650 Pa, the dielectric constant is as high as 3.0 or more. However, once the process pressure exceeds 650 Pa, the dielectric constant steeply drops to about 2.5. And the dielectric constant reaches a local minimum at a process pressure of 930 Pa. Thus, it can be seen that if the process pressure is 650 Pa or more, the organic components in the source material are not decomposed but incorporated effectively into the film. Also, these results coincide with the above-described finding that the electron temperature of the plasma is low and the decomposition of the source material is suppressed if the pressure inside the reaction chamber is 650 Pa or more.

In all of the foregoing embodiments, if the mass of the nitrogen monoxide gas as the oxidizing agent is equal to or less than its chemical equivalent for the organosilicon compounds, then silicon, constituting the organosilicon compounds, is less likely to contribute to the formation of a silicon dioxide film. Thus, the organosilicon bonds can be incorporated into the organic/inorganic hybrid film effectively and the dielectric constant of the interlayer dielectric film can be further reduced.

Also, in any of the foregoing embodiments, the organosilicon compound contained in the source material does not have to be hexamethyldisiloxane or dimethyldiethoxysilane but may be selected from the group consisting of methyltrialkoxysilane, dimethyldialkoxysilane, trimethylalkoxysilane, tetramethylsilane and a mixture thereof.

What is claimed is:

1. A method for forming an interlayer dielectric film, comprising the step of forming the interlayer dielectric film out of an organic/inorganic hybrid film by polymerizing a source material within plasma with a first electron temperature lower than a second electron temperature which causes organosilicon bonds to decompose by the plasma, the source material including an organosilicon compound.

2. The method of claim 1, wherein the organosilicon compound has an Si—O—Si bond.

3. The method of claim 1, wherein the organosilicon compound has an Si—O—R bond, where R is selected from the group consisting of alkyl, allyl and aryl groups.

4. The method of claim 1, wherein the organosilicon compound is selected from the group consisting of hexamethyldisiloxane, methyltrialkoxysilane, dimethyldialkoxysilane, trimethylalkoxysilane, tetramethylsilane and a mixture thereof.

5. The method of claim 1, wherein the plasma polymerization is conducted at a temperature of 350° C. or more.

6. The method of claim 1, wherein the plasma polymerization is conducted within an environment in which an oxidizing agent is contained.

7. The method of claim 6, wherein the oxidizing agent is nitrogen monoxide.

8. The method of claim 6, wherein the mass of the oxidizing agent contained is equal to or less than its chemical equivalent for the organosilicon compound.

9. The method of claim 1, wherein the interlayer dielectric film is formed by heating the organic/inorganic hybrid film to a temperature higher than a temperature set for the plasma polymerization.

10. The method of claim 1, wherein an organic compound is contained in the source material.

11. The method of claim 1, wherein the organic/inorganic hybrid film has an organosilicon bond.

12. The method of claim 1, wherein the plasma polymerization is conducted within an environment, in which a vacuum has a pressure of 650 Pa or more containing a dilute gas.

13. The method of claim 12, wherein the dilute gas is nitrogen gas.

14. The method of claim 9, wherein the interlayer dielectric film, having a porous structure is formed by the heating process.

15. The method of claim 10, wherein the organic compound is selected from the group consisting of methane, ethane, propane, butane, benzene, hexane or decahydronaphthalene.

* * * * *